United States Patent
Nomura et al.

(10) Patent No.: US 7,505,117 B2
(45) Date of Patent: Mar. 17, 2009

(54) POLARIZING ELEMENT, METHOD OF MANUFACTURING POLARIZING ELEMENT, METHOD OF EVALUATING EXPOSURE APPARATUS, METHOD OF MANUFACTURING SEMICONDUCTOR DEVICE, AND EXPOSURE APPARATUS

(75) Inventors: Hiroshi Nomura, Kawasaki (JP); Koji Asakawa, Tokyo (JP); Yuichi Motoi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 594 days.

(21) Appl. No.: 11/168,867

(22) Filed: Jun. 29, 2005

(65) Prior Publication Data

US 2006/0018018 A1 Jan. 26, 2006

(30) Foreign Application Priority Data

Jun. 29, 2004 (JP) ............................. 2004-191927

(51) Int. Cl.
*G03B 27/72* (2006.01)
(52) U.S. Cl. ....................................... 355/71
(58) Field of Classification Search ............... 355/53, 355/67, 71; 428/375
See application file for complete search history.

(56) References Cited

U.S. PATENT DOCUMENTS

| | | | |
|---|---|---|---|
| 3,813,265 | A | 5/1974 | Marks |
| 6,108,131 | A | 8/2000 | Hansen et al. |
| 6,452,724 | B1 | 9/2002 | Hansen et al. |
| 2001/0052968 | A1 | 12/2001 | Shiozawa |
| 2003/0180472 | A1 | 9/2003 | Zhou et al. |
| 2003/0234348 | A1 | 12/2003 | Takeuchi et al. |
| 2004/0047038 | A1 | 3/2004 | Jiang et al. |
| 2005/0105087 | A1 | 5/2005 | Nomura |

FOREIGN PATENT DOCUMENTS

| | | |
|---|---|---|
| DE | 103 04 822 A1 | 12/2004 |
| JP | 2002-198281 | 7/2002 |
| JP | 2002-365427 | 12/2002 |
| JP | 2003-257304 | 9/2003 |
| JP | 2004-102217 | 4/2004 |

OTHER PUBLICATIONS

Partial European Search Report, issued by European Patent Office, dated Nov. 4, 2005, for European Patent Application No. 05014025.0-2217.
Jiang et al., "Spinning continuous carbon nanotube yarns," Nature (Oct. 24, 2002), 419:801.
Partial European Search Report, issued by European Patent Office, dated Jan. 30, 2006, for European Patent Application No. 05014025.0-2217.
Chen et al., "Field emission of different oriented carbon nanotubes," Applied Physics Letters (Apr. 24, 2000), 76:2469-2471.

*Primary Examiner*—Della J. Rutledge
(74) *Attorney, Agent, or Firm*—Finnegan, Henderson, Farabow, Garrett & Dunner, L.L.P.

(57) ABSTRACT

A polarizing element is disclosed which includes a smooth glass substrate and a polarization layer formed thereon, the polarization layer having polarization characteristics for the incident light. The polarization layer is made of a carbon-based substance including carbon atoms. The carbon atoms are continuously connected via carbon-carbon double bonds having [pi] electron clouds. The [pi] electron clouds have average continuous distance of 100 nm or more in a longitudinal direction and have an average continuous distance less than 50 nm in a transverse direction. The carbon-based substance is formed in such a way that a plurality of the [pi] electron clouds have longitudinal directions which are in parallel along the glass-substrate surface.

4 Claims, 4 Drawing Sheets

POLARIZING ELEMENT, METHOD OF MANUFACTURING POLARIZING ELEMENT, METHOD OF EVALUATING EXPOSURE APPARATUS, METHOD OF MANUFACTURING SEMICONDUCTOR DEVICE, AND EXPOSURE APPARATUS

CROSS-REFERENCE TO PRIOR APPLICATION

This application is based upon and claims the benefit of priority from the prior Japanese Patent Application No. 2004-191927, filed on Jun. 29, 2004, the entire content of which is incorporated herein by reference.

BACKGROUND OF THE INVENTION

1. Field of the Invention

The present invention relates to a polarizing element, a method of manufacturing the polarizing element, a method of evaluating an exposure apparatus using the polarizing element, a method of manufacturing a semiconductor device, and the exposure apparatus.

2. Description of the Related Art

An exposure apparatus has been widely used to expose a circuit pattern of the liquid crystal display device or semiconductor device. The exposure apparatus can perform the so-called lithography process in which the original pattern formed on a photomask is reduced and transferred to the substrate. With requirements for smaller semiconductor devices, the shorter wavelength of the light source and the larger diameter of the projection optical system have been promoted for the higher resolution performance. An exposure apparatus with a NA of 0.9 or more using the ArF excimer laser of 193 nm wavelength is going from the development stage to the practical application stage. An ArF immersion-type exposure apparatus has been developed which fills liquid in a space between the lowest lens of the projection optical system and the substrate and can provide a NA of 1.0 or more on an air basis. A $F_2$ exposure apparatus has also been developed which uses the $F_2$ excimer laser of 157 nm wavelength. $F_2$ immersion-type exposure apparatus has also been discussed.

In such a larger-diameter exposure apparatus, the polarization has become an important factor, which polarization was hardly seen as a problem in the conventional exposure apparatuses. The conventional exposure apparatuses have often converted the laser light from the light source device into non-polarized state before illuminating the mask. The non-polarized light includes an equal amount of an s-polarized component and a p-polarized component. The p-polarized component decreases the image contrast in the larger-diameter exposure apparatus. Before projecting the non-polarized light, therefore, the exposure apparatus needs to convert the non-polarized light into tangential linear polarization which includes more s-polarized component.

An optical element called a polarizing element has been used to control the polarization state. The polarizing element generally falls into a prism-type element and a filter-type element.

The prism-type polarizing element uses the nature of the birefringence or Brewster Angle or the like. The prism type is characterized by a smaller extinction degree (an extinction ratio for the arrangement in the crossed nicols condition) and a higher polarization performance. The prism-type element, however, suffers from problems in which it has a larger thickness and needs a larger installation space and has a small viewing angle.

In contrast, The filter-type polarizing element generally has poorer polarization characteristics than the prism-type element. The filter-type element has, however, advantages that it can be formed more thinly and be located in a smaller installation space and has a larger viewing angle (obliquely-incident light acceptable), or the like. By way of example, the filter-type polarizing element can be formed by rolling in one direction a glass substrate mixed with conductive particles such as the silver halide and forming the silver halide particles into a hyperelliptical shape. The hyperelliptical-shaped silver halide particles cause the anisotropic electric conduction which provides the polarization characteristics. The filter-type polarizing element cannot, however, apply to the filters used in the ultraviolet light region. This is because it is impossible to roll fluorite or fluorine-doped quartz glass or the like, which is highly transparent even for the ultraviolet light, with silver halide particles mixed therein.

Another well-known form of the filter-type polarizing element is a polarizing element called a wire grid polarizer (WGP). The wire grid polarizer (WGP) includes a glass substrate on which metal thin lines such as aluminum are equally spaced. The wire grid polarizer uses the anisotropic electric conduction as in the above-described polarization filter. The WGP needs to have the metal thin lines located in an interval sufficiently smaller than the wavelength of the light to be polarization-controlled. The WGP is currently in practical use only for the wavelength longer than the infrared region due to the restricted machining accuracy. It has been reported that at the laboratory level an electron beam lithography device can produce WGP of about 200 nm cycle, which WGP can even control the polarization of the visible light. The WGP has been partially commercially available (see U.S. Pat. No. 6,108,131).

It is not expected, however, that the WGP can provide the filter-type polarizing element that can control the polarization of the light in a deep-ultraviolet region (with a wavelength of 200 nm or less). To provide the filter-type polarizing element available in an exposure apparatus using an ArF excimer laser of 193 nm wavelength or a $F_2$ exposure apparatus using a $F_2$ excimer laser of 157 nm wavelength using the WGP, the metal thin lines need to be located in an interval of 50 nm or less. This is hard to realize with the current electron-beam machining technology.

Japanese application patent laid-open publication No. 2004-102217 or the like has suggested a polarizing element that is formed by closely arranging the carbon nanotubes on a transparent substrate, which carbon nanotubes have received attention as the new nano carbon materials. Japanese application patent laid-open publication No. 2004-102217 has disclosed a polarizing element that is formed by growing a plurality of carbon nanotubes, extracting a bundle of carbon nanotubes with tweezers or the like, and closely arranging the bundle on a transparent substrate. Note that, although not relating to the polarizing element, Japanese application patent laid-open publication No. 2003-257304 and Y. Chan et. al., Appl. Phys. Lett. 76, 2469 (2000) are well known to disclose the method of arranging the carbon nanotubes.

However, the method disclosed in the patent laid-open publication No. 2004-102217 has the difficulty in extracting long carbon nanotubes ropes because the strength of adhesion between adjacent nanotubes is not uniform, so long aligned ropes of nanotubes cannot be obtained by that method.

Furthermore, the above-described Japanese application patent laid-open publication No. 2004-102217 discloses a polarizing element that uses a silicon substrate, which cannot transmit light with a shorter wavelength than the visible light. In addition, the patent performs heat treatments of 400 degrees Celsius/10 hrs and 650 degrees Celsius/5-30 min, which may cause color centers in the quartz substrate used in the present invention. The patent thus cannot provide a polarizing element available in the deep-ultraviolet region (with a wavelength of 200 nm or less).

SUMMARY OF THE INVENTION

A polarizing element according to the first aspect of the present invention is a polarizing element including a smooth glass substrate and a polarization layer formed thereon, the polarization layer having polarization characteristics for incident light, wherein the polarization layer is made of a carbon-based substance including carbon atoms, the carbon atoms are continuously connected via carbon-carbon double bonds having [pi] electron clouds, the [pi] electron clouds have average continuous distance of 100 nm or more in a longitudinal direction and have an average continuous distance less than 50 nm in a transverse direction, and the carbon-based substance is formed in such a way that a plurality of the [pi] electron clouds have longitudinal directions which are in parallel along the glass-substrate surface.

A polarizing element according to the second aspect of the present invention is formed by performing: forming on a substrate by plasma CVD a carbon-based substance extending in a direction vertical to the substrate; and tilting the carbon-based substance in one direction by applying a mechanical stress from one direction at a position which is a predetermined distance away from the carbon-based substance.

A method of manufacturing a polarizing element according to the third aspect of the present invention comprises: vertically orienting and growing on a flat substrate a carbon-based substance which has a linear structure including carbon atoms connected mainly via a double bond; and tilting and orienting the carbon-based substance in parallel with a substrate surface by applying a mechanical stress in one direction parallel with the substrate surface at a position which is a predetermined distance away from a contact portion with the carbon-based substance substrate.

A method of evaluating an exposure apparatus according to the fourth aspect of the present invention is a method of evaluating an exposure apparatus which uses an excimer-laser light as a light source, projects a light from the excimer laser onto a mask pattern through a illumination optical system, and reduces and projects the mask pattern onto a wafer substrate through a projection optical system, the method including evaluating polarization-conversion characteristics of the illumination optical system or evaluating the projection optical system, or polarization state of the excimer-laser light when it reaches the wafer substrate, wherein a polarizing element is used which includes a smooth glass substrate and a polarization layer located thereon, the polarization layer having polarization characteristics for the excimer-laser light, the polarization layer is mainly made of a carbon-based substance including carbon-carbon double bonds, the double bonds having [pi] electron clouds which have an average continuous distance less than 50 nm in a transverse direction and have an average continuous distance of 100 nm or more in a longitudinal direction, the [pi]electron clouds are located in such a way that the longitudinal directions of the continuous distances are in the same direction and are parallel with the glass-substrate surface, the polarizing element is located between the illumination optical system and the projection optical system, or is located downstream of the projection optical system.

A method of manufacturing a semiconductor device according to the fifth aspect of the present invention is a method of manufacturing a semiconductor device with an exposure apparatus which uses an excimer-laser light as a light source, illuminates the excimer laser onto a mask pattern through a illumination optical system, and reduces and projects the mask pattern onto a wafer substrate through a projection optical system, the method including evaluating polarization-conversion characteristics of the illumination optical system or the projection optical system, or evaluating polarization state of the excimer-laser light when it reaches the wafer substrate, and using the evaluation as a basis to adjust the illumination optical system or the projection optical system, and then exposing the wafer substrate to the excimer-laser light to manufacture the semiconductor device, wherein a polarizing element is used which includes a smooth glass substrate and a polarization layer located thereon, the polarization layer having polarization characteristics for the excimer-laser light, the polarization layer is mainly made of a carbon-based substance including carbon-carbon double bonds, the double bonds having [pi] electron clouds which have an average continuous distance less than 50 nm in a transverse direction and have an average continuous distance of 100 nm or more in a longitudinal direction, the [pi] electron clouds are located in such a way that the longitudinal directions of the continuous distances are in the same direction and are parallel with the glass-substrate surface, the polarizing element is located between the illumination optical system and the projection optical system, or is located downstream of the projection optical system.

An exposure apparatus according to the sixth aspect of the present invention comprises: an excimer laser emitting excimer-laser light; a illumination optical system which introduces the excimer-laser light onto a mask; a projection optical system which projects projection light formed by a mask pattern of said mask onto a wafer substrate; and a polarizing element which is located in an optical path of the excimer-laser light or the projection light to evaluate polarization-conversion characteristics of the illumination optical system or the projection optical system, or polarization state of the excimer-laser light when it reaches the wafer substrate, wherein the polarizing element includes a smooth glass substrate and a polarization layer formed thereon, the polarization layer having polarization characteristics for incident light, the polarization layer is made of a carbon-based substance including carbon atoms, the carbon atoms are continuously connected via carbon-carbon double bonds having [pi] electron clouds, the [pi] electron clouds have an average continuous distance of 100 nm or more in a longitudinal direction and have an average continuous distance less than 50 nm in a transverse direction, and the carbon-based substance is formed in such a way that a plurality of the [pi] electron clouds have longitudinal directions which are in parallel along the glass-substrate surface.

DETAILED DESCRIPTION OF THE INVENTION

Figure 1:
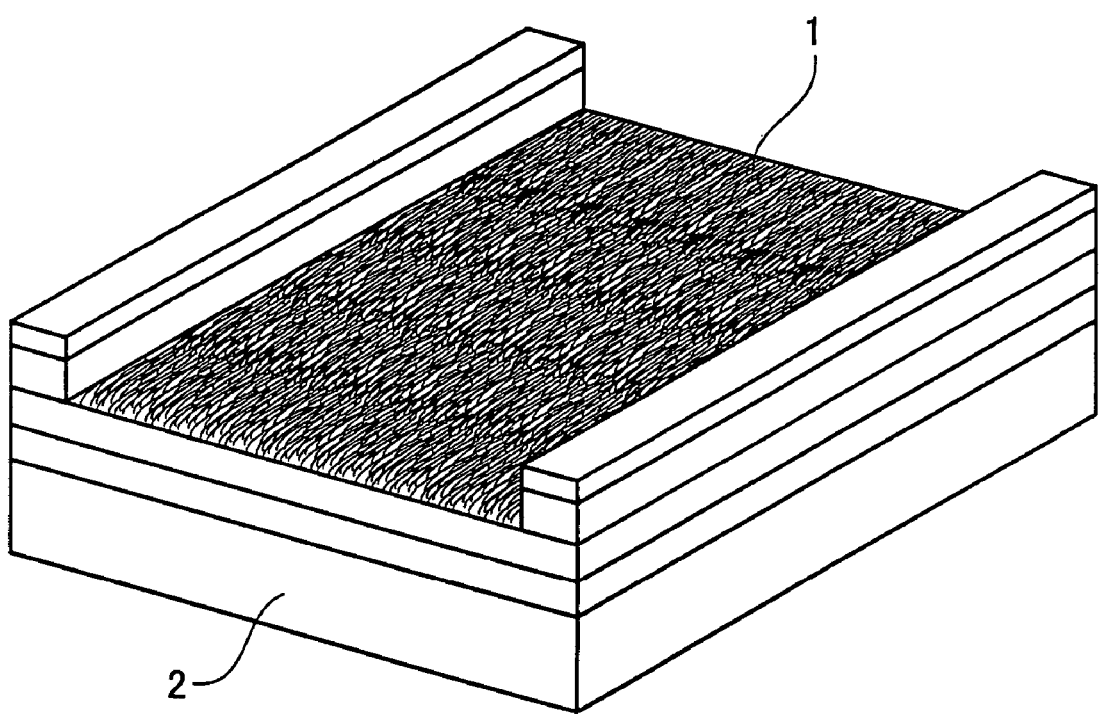
FIG. 1 shows a structure of a polarizing element in an embodiment according to the present invention.

Basic principle of the present invention will first be described below.

An average continuous distance is determined as follows. In the carbon-carbon double bond, the carbon atoms share their electrons to form a [pi] electron cloud. The electrons are thus not bound to a specific carbon atom and can move around in the electron cloud like the metal electrons. The electrons can therefore move in the direction of the carbon-carbon bond and provide conductivity. This holds true in a compound such as polyacetylene which has a number of carbon atoms connected one-dimensionally via the carbon-carbon double bonds, or a hydrocarbon compound such as graphite which has a number of carbon atoms extending two-dimensionally via the carbon-carbon double bonds. A conjugated state is a state in which a plurality of carbon-carbon double bonds are connected and the [pi] electron clouds are shared, as described above. In these electron clouds, however, the electrons can move in the [pi]-[pi] bond direction, but cannot transfer to nearby other electron clouds. Anisotropic conductivity thus occurs. If the light, particularly the ultra-violet light of a shorter wavelength, is directed to a double bond that has sufficiently long conjugation of the [pi]-[pi] bond, the electrons shared in the [pi] electron cloud will be vibrated. In contrast, the electrons in the short conjugate length will not resonate with the vibration caused by the electromagnetic waves or react with the light. For a plane having the carbon-carbon conjugate length extending in one direction thereon and the short conjugate length in the other direction, the directed electromagnetic waves will be attenuated in one direction but not in the other direction. This will cause the polarization. The present invention uses the principle described above.

Such a phenomenon will be realized by a carbon compound that has carbon-carbon double bond with an average conjugate length less than 50 nm in one direction for the incident light and an average conjugate length of 100 nm or more in the other direction. For example, a structure such as graphite having continuous aromatic rings has different light absorption in the graphite sheet direction and the direction vertical to the sheet. Particularly in a structure such as the carbon nanotube having a graphite sheet having a circularly closed structure, the [pi] electron cloud cannot extend radially beyond the diameter of the nanotube, but can extend much longer in the axial direction of the carbon nanotube. Carbon nanotube can thus be oriented to provide quite different continuities of the [pi] electron cloud in the two axial directions. This can thus polarize the irradiated electromagnetic waves.

When mixture of plural molecules exist, the molecules cannot all be oriented. The present invention then defines the average continuous distance <L>. The light basically reacts to a substance in proportion to the momentum of the amount of the substance. The present invention thus defines the average amount as follows.

$$<L> = \sigma L^2 n_L / \sigma L n_L \text{ (where } n_L \text{ is the number of molecules which have the [pi] electron cloud with a conjugate length } L) \quad \text{[Formula 1]}$$

If the average continuous distance is 100 nm or more in the longitudinal direction, and is less than 50 nm in the transverse direction, an anisotropy will be provided to the ultra-violet light of a shorter wavelength generated from the excimer lasers of KrF, ArF, $F_2$. A "carbon-based substance" is typically a carbon nanotube, but may be any substance that includes a cylindrically formed graphite. The substance may be a substance that has a diameter more than 50 nm, such as carbon fiber and carbon tube. The general carbon nanotube has a diameter of 50 nm or less. A honeycomb-like network including carbon atoms connected via the double bonds having [pi] electron clouds is referred to as a graphene sheet. The carbon nanotube includes a monolayer carbon nanotube including a single layer of the graphene sheet formed into a cylinder, and a multilayer carbon nanotube including a number of the graphene sheets formed into co-axial cylinders. Either of the monolayer and multilayer carbon nanotubes may be used. It is preferable, however, that the carbon nanotube has the metal-like electric conduction characteristics, other than the semiconductor-like one, in the longitudinal direction. The cylindrical carbon preferably has a diameter that is preferably one half or less, and more preferably a twentieth, of the wavelength of the light used. When, for example, the light of 157 nm wavelength is used, the polarizer may preferably include the carbon nanotube with a diameter of 8 nm or less. Any substance may be used that satisfies the requirements defined in the first aspect of the present invention, such as a layer on which polyacetylene is oriented.

It is now assumed that the carbon-based substance includes carbon atoms that are connected via the double-bonds including [pi] electron clouds, and the [pi] electron clouds have an average continuous distance of 100 nm or more in the longitudinal direction and have an average continuous distance less than 50 nm in the transverse direction, and a plurality of [pi] electron clouds have longitudinal directions which are in parallel. In this case, the electrons cannot move between the discontinuous [pi] electron clouds. It is thus unnecessary to form the carbon-based substances in separate pieces in a non-contact manner unlike the metal lines in the polarizing element by the wire grid pattern. A polarization layer can thus be formed to have a cycle equal to the transverse-direction length of the carbon-based substance. The transverse-direction length of the carbon-based substance can be controlled by the size of the catalytic metal particles used when substance is made, and can easily be made less than 50 nm.

With the step of applying a mechanical stress from one direction at a position which is a predetermined distance away from the carbon-tube substance in order to tilt the carbon-based substances in one direction, the carbon-based substances arranged in one direction on the substrate can easily be formed. The polarizing element available in the deep-ultraviolet region can thus easily be provided.

Referring now to FIG. 1, the polarizing element according to one embodiment of the present invention will be described. FIG. 1 illustrates a structure of the polarizing element according to the embodiment. With their longitudinal directions being in the same direction, a number of carbon-nanotube layers 1 are arranged in parallel on a transparent substrate 2 such as a artificial fluorite or a fluorine-doped quartz substrate, which has a high transmittance even for the ultraviolet light. Each carbon-nanotube layer 1 has a length of about 100 nm to 1 mm, and a diameter (contour) of about 0.4 to 50 nm. The carbon-nanotube layer 1 includes carbon atoms which form aromatic rings. Six carbon atoms in one aromatic ring are connected via the [pi] bonds, so are the adjacent aromatic rings. The carbon atoms connected via the [pi] bond share the [pi] electron cloud (this is referred to as a conjugated state). The [pi] electron cloud is continuous in a range in which the [pi] bond is continuous. Each carbon nanotube has a length of as long as 100 nm or more, while it has a diameter less than 50 nm. The carbon nanotube can thus provide anisotropic conductivity, providing a polarization characteristics as in the polarizing element of the wire grid pattern, even for the light in the deep-ultraviolet region.

Figure 2:
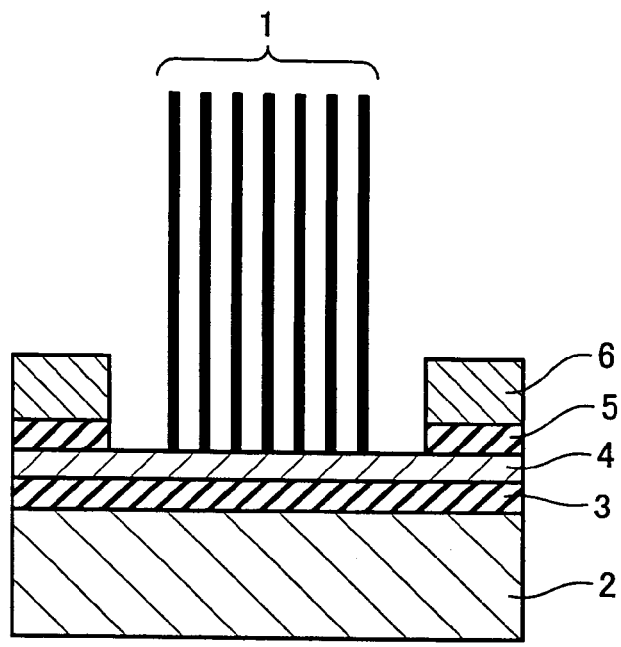
FIG. 2 illustrates a method of manufacturing the polarizing element shown in FIG. 1.
Figure 3:
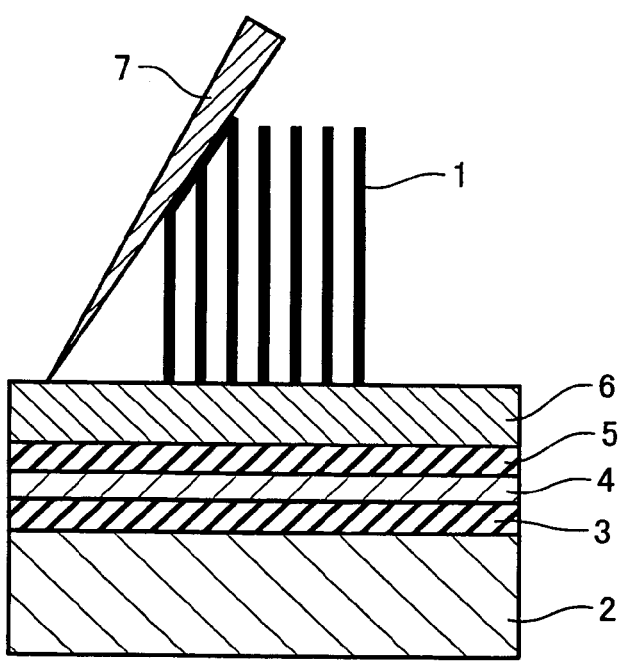
FIG. 3 illustrates a method of manufacturing the polarizing element shown in FIG. 1.
Figure 4:
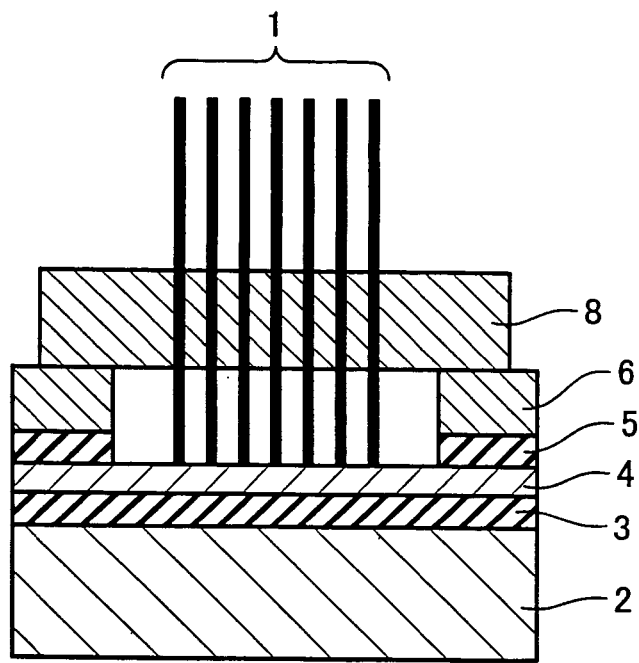
FIG. 4 illustrates a method of manufacturing the polarizing element shown in FIG. 1.

Referring now to FIG. 2 to FIG. 4, a detailed description is given of the method of manufacturing the polarizing element 1. On the fluorine-doped quartz-glass substrate 2 serving as the transparent substrate, a titanium (Ti) layer 3 is sputtered as an adhesion layer to a thickness of 10 nm. On the titanium layer 3, a cobalt (Co) layer 4 is sputtered to a thickness of 80 nm as a catalyst layer for the CVD growth of the carbon nanotube. The cobalt may be replaced by the iron group metals such as iron (Fe) and nickel (Ni), or the platinum group metals such as palladium (Pd) and platinum (Pt), or alloys thereof.

A titanium layer 5 is then sputtered as an adhesion layer at the periphery on both sides of the quartz-glass substrate 2 to a thickness of 10 nm. On the titanium layer 5, a silicon dioxide ($SiO_2$) layer 6 is sputtered as a spacer layer to a thickness of 3 um. The silicon dioxide layer 6 deposited as the spacer layer can form a difference in height between the periphery and central part on the quartz-glass substrate 2. Then, microwave plasma CVD is used to produce, on the central part of the quartz-glass substrate 2, the carbon-nanotube layer 1 that is oriented in a direction vertical to the substrate surface. Note that the quartz-glass substrate 2 preferably has the crystal axis, leading phase axis, or lagging phase axis which is set parallel with the longitudinal direction of the carbon nanotube because the parallelism can cause a negligible variation of the polarization state.

A description is now given of the method of producing the carbon-nanotube layer 1 by microwave plasma CVD. A pretreatment is first performed by the hydrogen plasma. By way of example, with supplying a hydrogen gas at a flow rate of 82.5 SCCM, in the environment of the total pressure of 1.35 Torr and the temperature ranging from room temperature to 601 degrees Celsius, a DC bias −176 V is applied to the quartz-glass substrate 2 and a plasma discharge is caused for 10 minutes with a microwave of 500 W output. The hydrocarbon such as methane serving as the material gas is then added to grow the carbon-nanotube layer 1 by plasma CVD. With supplying the hydrogen gas at a flow rate of 82.5 SCCM and the methane at 17.5 SCCM, in the environment of the total pressure of 1.70 Torr and the temperature ranging from room temperature to 600-700 degrees Celsius, a DC bias −250 V is applied to the quartz-glass substrate 2, and plasma discharge is caused for 20 minutes with a micro wave of 500 W output. This grows the carbon nanotube to a length of about 10 um to 12 um.

As shown in FIG. 3, a blade 7 is then moved in parallel over the silicon dioxide layer 6 of about 6 um thickness as a spacer layer. This can apply a mechanical stress in a direction parallel to the substrate surface at about 6 um above the bottom portion of the carbon-nanotube layer 1 (the contact portion with the quartz-glass substrate 2). This can tilt the carbon-nanotube layer 1 in one direction in the substrate surface. The silicon dioxide layer 6 as the spacer layer allows stress application without any mechanical contact to the interface portion between the carbon-nanotube layer 1 and the glass substrate 2. The carbon-nanotube layer 1 can thus be arranged in one direction in the substrate surface of the glass substrate 2. The silicon dioxide layer 6 needs to have a thickness less than the length of the carbon nanotube that is vertically oriented and grown. The layer 6 thickness is preferably one half or less of the carbon-nanotube length. In addition, the thickness is preferably less than the amount of the substrate distortion and the size of the concave/convex at the edge blade portion of the blade 7. For example, for the silicon dioxide layer 6 with a thickness of 6 um, the peak to peak distance of the concave/convex at the edge blade portion of the blade 7 is preferably within +/− 3 um such that the distance is almost equal to or less than the thickness of the silicon dioxide layer.

As shown in FIG. 4, the blade 7 may be replaced by a roller 8 which rolls on the silicon dioxide layer 6 to tilt the carbon-nanotube layer 1 in one direction. Note that, for the silicon dioxide layer 6 with a thickness of 6 um, the concave/convex at the central part of the roller 8 is preferably within +/−3 um.

Figure 5:
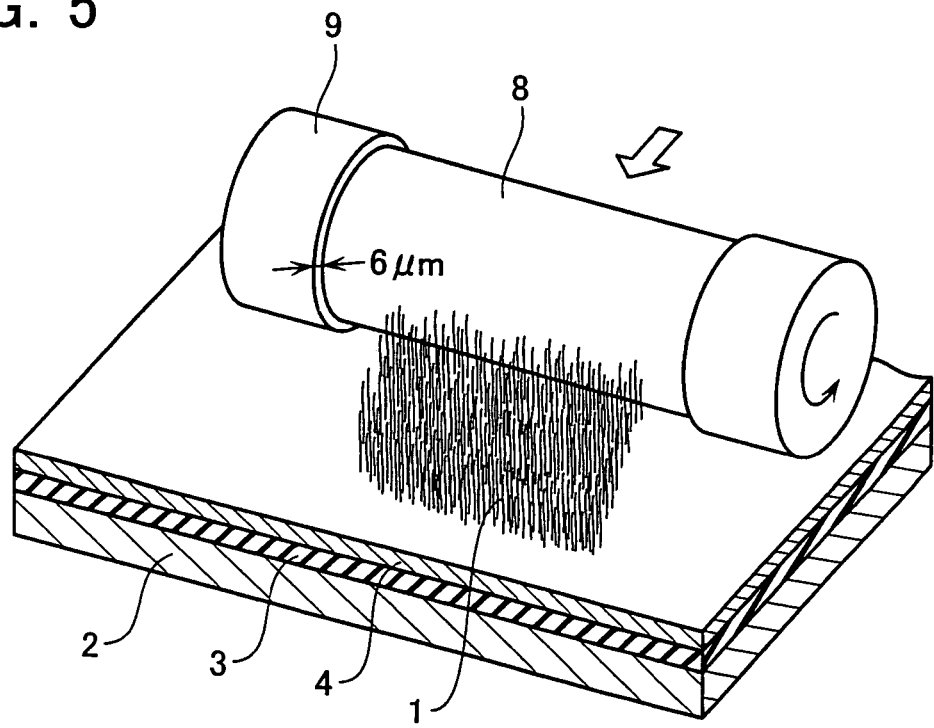
FIG. 5 illustrates a method of manufacturing the polarizing element shown in FIG. 1.

As shown in FIG. 5, the silicon dioxide layer 9 of about 6 um thickness may be provided around both ends of the roller 8 as a spacer layer. The layer 9 can roll on the carbon-nanotube layer 1 to tilt the carbon-nanotube layer 1 in one direction. The silicon dioxide layer 9 may be formed of the same material as the roller 8. The method shown in FIG. 5 can orient the carbon nanotube without the silicon dioxide layer 6 provided on the substrate 2, thereby causing higher productivity.

Figure 6:
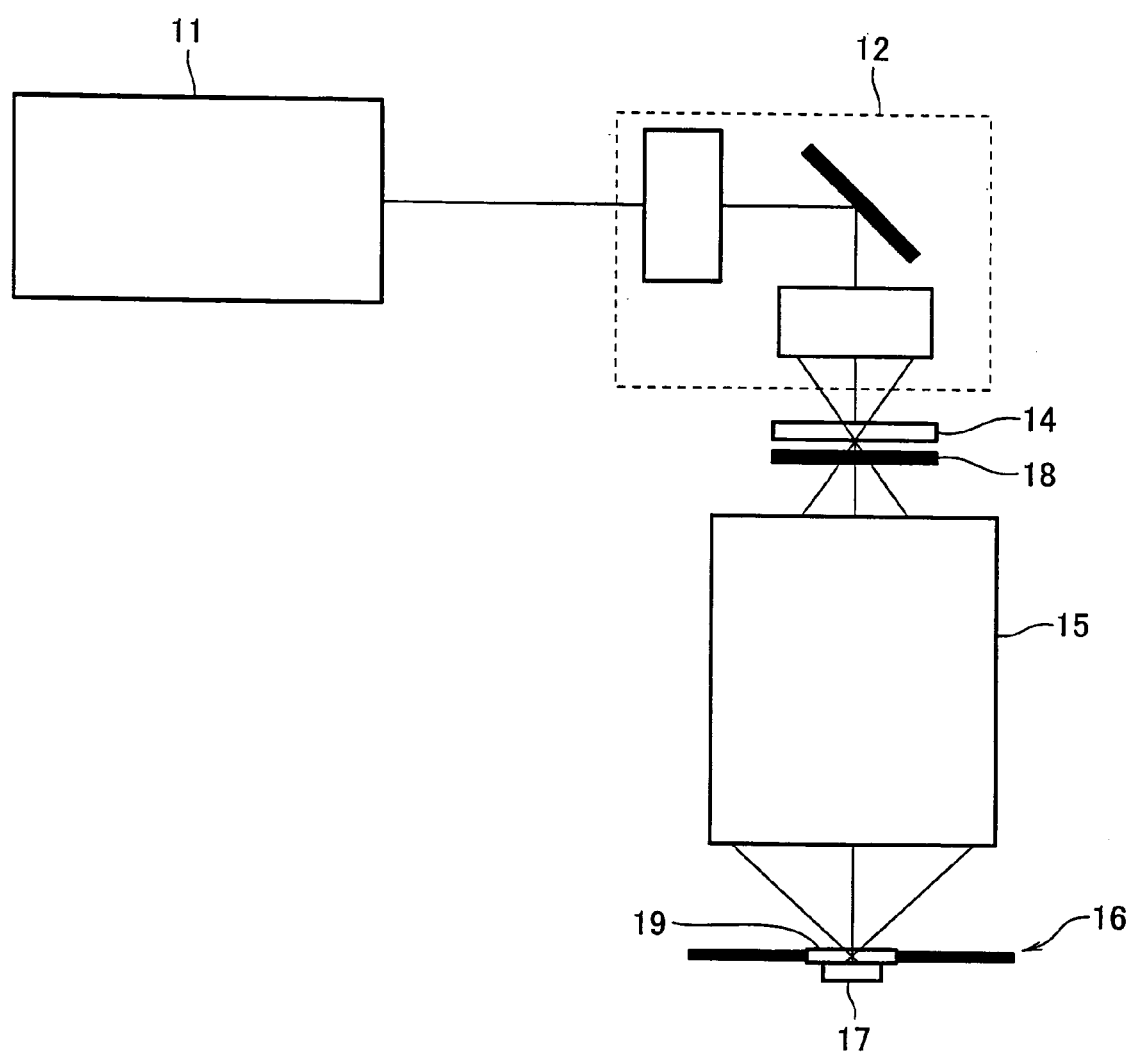
FIG. 6 shows an exposure apparatus using the polarizing element shown in FIG. 1.

FIG. 6 schematically shows the semiconductor exposure apparatus. The excimer laser device 11 emits the excimer-laser light which enters the illumination optical system 12 before illuminating the mask 14. The illumination optical system 12 adjusts the illumination shape and illumination intensity distribution of the light. After passing through the mask 14, the excimer-laser light enters the projection optical system 15 which changes the traveling direction of the light. The excimer-laser light then reaches the wafer substrate 16. The excimer-laser light reduces and transfers the pattern on the mask 14 onto the wafer substrate 16. The polarization-conversion characteristics of the illumination optical system 12 is evaluated by locating the polarizing element 18 directly above or below the mask 14 (FIG. 5 illustrates the element 18 directly below the mask 14), and by measuring the intensity of the transmitted light with the detector 17 located downstream of the polarizing element (FIG. 5 illustrates the detector 17 near the imaging plane). After changing the direction of the polarizing element 18, the same measurement is performed. The relation between the polarizing element 18 direction and the measurement can provide the evaluation of the polarization-conversion characteristics.

The polarization-conversion characteristics of the projection optical system 15 is evaluated by locating the polarizing element 19 near the position of the wafer substrate, and by performing the same measurement as described above. The relation between the polarizing element 18 direction and the measurement can provide the evaluation of the polarization-conversion characteristics. The example shown in FIG. 5 uses the detector 17 to measure the transmitted-light intensity. The detector 17 may be replaced by a wafer substrate coated with a photosensitive layer.

Such an evaluation can be used as a basis to adjust the illumination optical system 12 or projection optical system 15 of the exposure apparatus. The exposure apparatus can then expose the wafer substrate to manufacture the semiconductor device by projecting the mask pattern onto the wafer substrate with a high image contrast.

What is claimed is:

1. A method of manufacturing a polarizing element, comprising:
    vertically orienting and growing on a flat substrate a carbon-based substance which has a linear structure including carbon atoms connected mainly via a double bond; and
    tilting and orienting said carbon-based substance in parallel with a substrate surface by applying a mechanical stress in one direction parallel with the substrate surface at a position which is a predetermined distance away from a contact portion with the carbon-based substance.

2. A method of manufacturing a polarizing element according to claim 1, further comprising forming a spacer on said substrate to provide said predetermined distance.

3. A method of manufacturing a polarizing element according to claim 2, wherein tilting said carbon-based substance is performed by moving a tool along said spacer.

4. A method of manufacturing a polarizing element according to claim 1, wherein tilting said carbon-based substance is performed by moving a roller on said substrate, said roller having around both ends spacers for said predetermined distance.

* * * * *